(12) United States Patent
Pie et al.

(10) Patent No.: US 7,370,308 B2
(45) Date of Patent: *May 6, 2008

(54) INTEGRATED CIRCUIT ANALYSIS METHOD AND PROGRAM PRODUCT

(75) Inventors: Charles Corey Pie, Fort Collins, CO (US); Gregory Louis Ranson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 168 days.

This patent is subject to a terminal disclaimer.

(21) Appl. No.: 11/261,951

(22) Filed: Oct. 27, 2005

(65) Prior Publication Data

US 2006/0048086 A1    Mar. 2, 2006

Related U.S. Application Data

(63) Continuation of application No. 10/059,486, filed on Jan. 29, 2002, now Pat. No. 6,996,792.

(51) Int. Cl.
    *G06F 17/50*    (2006.01)

(52) U.S. Cl. .................. 716/12; 716/2; 716/6; 716/7; 716/11

(58) Field of Classification Search ............... 716/2, 716/6, 7, 12
    See application file for complete search history.

(56) References Cited

U.S. PATENT DOCUMENTS

| 5,452,239 A | 9/1995 | Dai et al. |
| 5,740,347 A * | 4/1998 | Avidan ............... 714/33 |
| 5,790,830 A | 8/1998 | Segal |
| 6,158,022 A | 12/2000 | Avidan |
| 6,378,113 B1 | 4/2002 | Levitsky et al. |
| 6,581,197 B1 | 6/2003 | Foutz et al. |

* cited by examiner

*Primary Examiner*—Thuan Do

(57) ABSTRACT

A method for analyzing integrated circuits (IC's) has steps of dividing the circuit into a plurality of individual blocks that are linked together. Each block is comprised of a plurality of latches and paths connecting the latches. The blocks are compressed by removing all detail not required for performing global transparency timing modeling.

4 Claims, 6 Drawing Sheets

INTEGRATED CIRCUIT ANALYSIS METHOD AND PROGRAM PRODUCT

This application is a continuation of application Ser. No. 10/059,486, filed Jan. 29, 2002 now U.S. Pat. No. 6,996,792.

FIELD OF THE INVENTION

The present invention is related to program products and methods for developing and testing circuitry. More particularly, the present invention is related to methods and program products for performing timing analysis on integrated circuits.

BACKGROUND OF THE INVENTION

As integrated circuits ("IC") have grown in complexity, the development and testing of the circuits has become increasingly difficult and demanding. Modern IC's may comprise transistors and the like that number into the millions, with a multiple of that number of transistor connection paths. In IC's, a signal must propagate through a number of gates and latches until it reaches its final destination. Gates may be thought of as simple logic switches that are either open or closed. Latches generally are comprised of one or more gates, and are capable of storing or "holding" an input signal until a desired event occurs, such as a clock tick, when the "held" signal is released. For example, a latch may receive an input first signal and "hold" it until a second input arrives at which time the latch transmits the "held" first signal.

As it propagates through the IC, a signal will encounter various delays, generally in the form of "gate delay" and "wire delay". Gate delay refers to time required for transistors such as "and gates," "or gates," "nor gates," etc. to operate. Wire delay refers to delay caused by the resistance of the carrying medium and other resistors, capacitors, and the like that are encountered between gates. In sum, the gate delay and wire delay that occurs along a connection path between latches may be referred to as the "path delay" between those latches.

Excessive delays can be disastrous to an IC. The IC may not be able to perform a desired application if it responds too slowly as latches operate out of sequence. Also, less than predicted delay raises the possibility of a so-called race condition that arises when one signal arrives at a desired destination out of sequence with another signal. Proper sequencing and stacking are critical to IC performance.

Circuits are generally provided with a clock signal for controlling the sequence of circuit operations. The clock signal in IC's generally comprises a continuous square wave signal that alternates between a high and a low voltage level. The clock signal can be used to control the sequence of IC logic by, for example, new data being presented to the inputs of various circuits every time the clock signal goes from high to low. It is critical for an IC manufacturer to provide IC's that meet their specified clock speed.

Various systems and methods are known for determining IC clock speeds and for insuring that the chip operates in the correct timing sequence. For modern day complex IC's, these systems and methods typically take the form of software circuit modeling tools. These timing tools generally operate by determining the path delay between latches as the signal propagates through the IC to determine a total delay.

As circuits have become increasingly larger and more complex, problems with these software timing modeling systems and methods have become apparent. Many of these problems relate to the resources required to use the systems. For example, running a timing model to test a very large system integration (VLSI) IC with its millions of paths and latches can require enormous amounts of memory and consume inordinate processor time. Often, memory and processing requirements are so large as to require dedicated and expensive memory systems. Also, required memory can become so great during the run that the available resources are exceeded and the test program crashes.

Solutions to these problems have been proposed. For example, the complexity of a timing analysis can be reduced by modeling an IC as a collection of connected sub-circuits. So-called "black box" timing models analyze these sub-circuits individually to determine purely "internal" sub-circuit delay. A total delay is assigned to each sub-circuit. To analyze the timing of the overall IC, or the "global" timing, these black box methods then consider the delay on the paths connecting the individual sub-circuits to one another, or "global paths," with no consideration given to internal operation of the sub-circuits other than use of the previously determined total delay.

While these simple black box models can reduce the memory requirements for running global timing tests, they have been discovered to be disadvantageous for some purposes. For example, by eliminating consideration of sub-circuit internal timing, these models are unable to model transparency effects.

Modeling transparency effects generally considers timing through transparent latches. Latches may be edge-triggered or level-triggered. Edge triggered devices generally sample a signal only upon the detection of the leading edge of a clock high or low signal. Edge triggered latches are generally referred to as being subject to fixed timing, with the time at which a signal is communicated being known and equal to the detection of the edge of the clock high signal. Level triggered latches, on the other hand, may be referred to as being transparent for timing purposes. Level triggered latches are activated and in an "on" state the entire time that the clock signal is in either its high (or low) state. Signals will be communicated any time they are received and the latch is in the on state. Level triggered latches thereby may be described as having a timing "window" to receive signals, with the window starting at the beginning of the clock high (or low) level signal and ending at the end of the high (or low) level signal.

In addition to black box models, an additional proposed solution to problems associated with required resources for timing models is to use so called "pruning" techniques to reduce the complexity of IC's. With these methods, a latch having a plurality of paths leading into it will have all but the path having the largest delay removed from consideration, or "pruned." The timing model will then be run with consideration of only that largest delay. Generally, the underlying assumption of such pruning practices is that global timing will only be affected by the worst-case path having the largest delay. By way of example, assume three global paths connect three different latches from three different blocks with a single latch in a fourth block. Pruning would remove all but the path having the largest delay from consideration.

Although pruning reduces the complexity of IC's for modeling, the practice as presently known is not without problems. For example, secondary global paths that have been pruned, although not being worst case, may yet have such a large delay associated with them that they are "broken." That is, the delay with a pruned path may be large enough that it will prevent the circuit from achieving its required speed. When the path is pruned, however, it is removed from the model and its broken status will not be detected.

Still an additional proposed solution comprises so-called "gray box" models. A gray box model may be thought of as a black box model with additional block detail. In particular, gray box models generally comprise block models having summed path delays for each path in the block. While these models may contain sufficient detail to perform global timing modeling, the level of detail they contain has proven to require substantial memory and processing resources. For substantial circuits such as VLSI IC's, in fact, gray box models have presented problems related to excessive memory and processing resource requirements.

These and other problems in the art remain heretofore unresolved.

SUMMARY OF THE INVENTION

The present invention is directed to methods and program products for modeling integrated circuits. An embodiment of a method of the invention comprises steps of dividing the circuit into a plurality of connected blocks, with each of the blocks having a plurality of internal latches and at least one having a global path connected to a latch on a different block. The method embodiment further comprises the step of compressing the blocks by removing all latches from each block not required for modeling global transparency.

Accordingly, embodiments of the invention provide methods for modeling integrated circuits in a compressed format to advantageously reduce required memory and processor resources. Some method embodiments can result in memory savings over prior art circuit modeling methods of the order of a ten times factor. Further, method embodiments retain in their compressed formats a level of circuit detail required for accurate modeling of circuit timing, and for modeling of global transparency. Methods of the present invention thereby solve many heretofore unresolved needs in the art.

Those knowledgeable in the art will appreciate that embodiments of the invention lend themselves well to practice in the form of computer program products. Accordingly, it will be appreciated that the present invention comprises computer program product embodiments that generally comprise computer executable instructions for causing a computer to carry out methods of the invention.

The above brief description sets forth some features of the present disclosure so that the detailed description that follows may be better understood. There are, of course, additional features of the disclosure that will be described hereinafter which will further describe the subject matter of the invention. In this respect, it is to be understood that the disclosure is not limited in its application to the details of the construction and the arrangements set forth in the following description or illustrated in the drawings. The present invention is capable of other embodiments, as will be appreciated by those skilled in the art. Also, it is to be understood that the phraseology and terminology employed herein are for description and not limitation.

DETAILED DESCRIPTION

Figure 1:
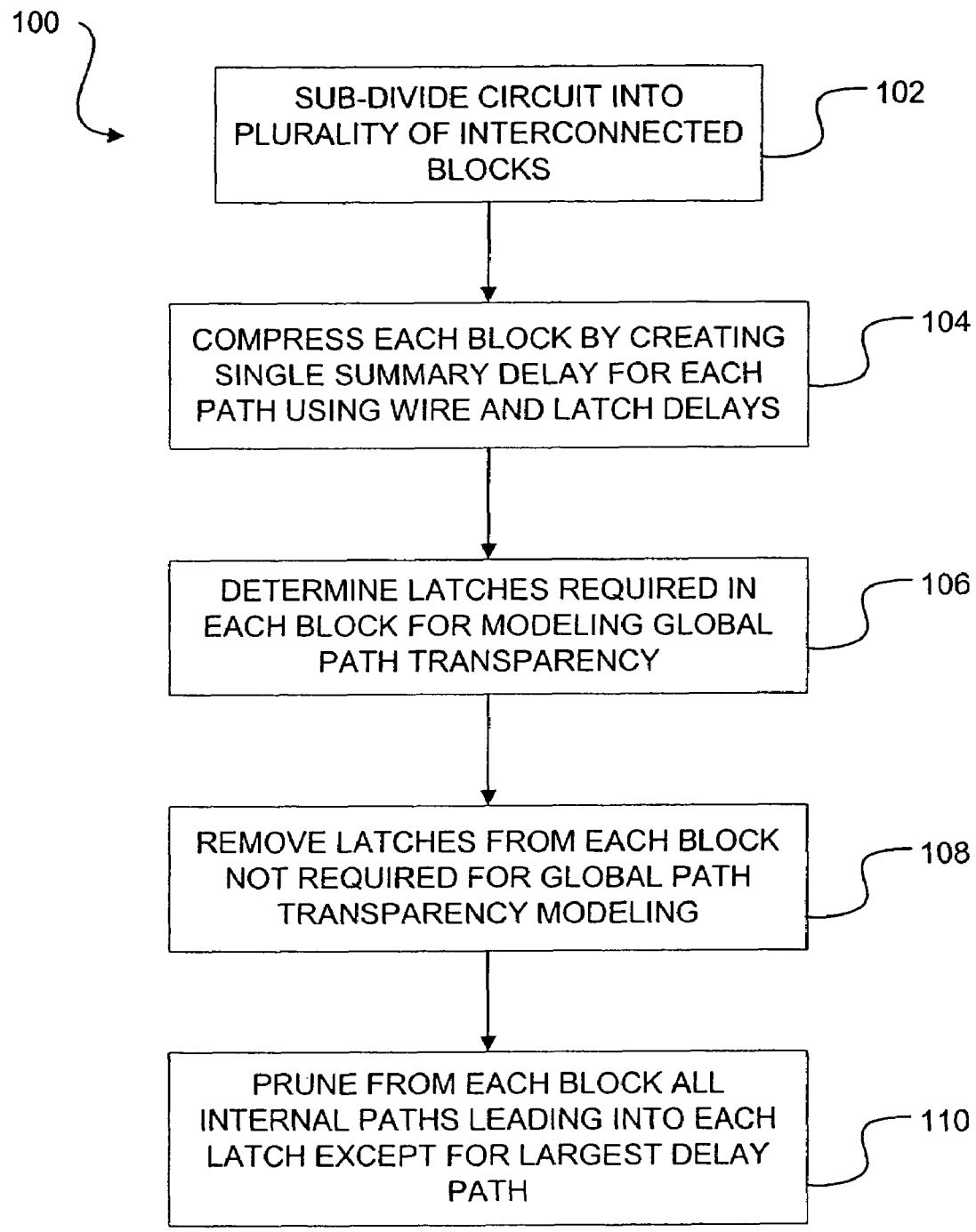
FIG. 1 is a flowchart illustrating steps of an invention embodiment.

Turning now to the drawings, FIG. 1 is a flowchart illustrating in general the steps of one invention method embodiment 100. This embodiment 100 comprises a step of dividing the circuit to be modeled into a plurality of interconnected blocks (step 102). Each of the blocks comprises a plurality of internal latches and paths connecting the latches. As used herein, the term "latch" is intended to broadly refer to any electronic component for receiving a signal, storing or "holding" the signal, and transmitting the stored or "held" signal upon or after receiving a second signal. Also, each block has at least one global path leading into it originating from another block. It will be appreciated that as used herein the term "global" as used to describe a path is intended to refer to a path that crosses the boundaries of one or more blocks to connect latches from the respective blocks to one another.

Those skilled in the art will appreciate that there are many different particular manners in which to divide a given integrated circuit into a plurality of blocks. Those skilled in the art will likewise appreciate that blocks are preferably created from a circuit in a functionally and/or architecturally hierarchal manner. Further, a particular circuit may be divided into any number of blocks as may be practical and/or desirable.

As initially created, the individual blocks may retain all of the detail of the integrated circuit. Internal paths between latches in each block will thereby comprise details that may comprise, for example, wire geometry along the path, gates along the path, and delays associated with wire (wire delay) and gates (gate delay) that will be encountered by a signal propagating along the path. Wire delay as used herein is intended to broadly refer to any delay associated with materials located between latches except for gates. For example, wire delay will comprise delay associated with resistors and capacitors encountered, as well as resistance associated with the carrier medium (e.g., resistance of a deposited metal layer carrier between latches in a chip based integrated circuit). Also, as used herein the term gate delay is intended to broadly refer to all delays associated with a signal passing through a gate such as a transistor.

The block may also retain information regarding the latch delay associated with each latch. As used herein, the term latch delay is intended to broadly refer to any delay associated with a latch. By way of example, latch delay may comprise the delay associated with the gates that comprise the latch, or the like.

Once the circuit has been subdivided into the plurality of blocks, the method embodiment 100 further comprises compressing each of the blocks by calculating a representative delay for each path using the individual gate and wire delays associated with that path (block 104). For example, the method may comprise summing all of the individual wire delays and the gate delays, with the resultant single delay value then associated with the path. Further detail regarding individual gates, resistors, capacitors, and the like along the path therefore will not be required. The amount of information contained in each of the blocks is thereby significantly reduced.

The method embodiment 100 further comprises a step of determining which of the plurality of latches within each block are required for modeling transparency (block 106). One set of steps for making this determination generally comprises following a signal as it propagates into a block and determining the time at which it arrives at each latch. A latch arrival time for each of the latches is compared to a latch "on-state" start time until a latch is found having a start time that is later than the respecting latch arrival time. This latch is determined to be a final latch, with all subsequent block latches unnecessary for global timing. The method embodiment 100 further comprises a step of removing these unnecessary latches (block 108).

An additional step of the method embodiment 100 comprises pruning each of the blocks to remove all paths leading into each latch except for the path having the largest delay (block 110). Global paths are preferably not pruned, however. It has been discovered that pruning of global paths may disadvantageously remove paths from consideration that have a significant effect on global timing. Accordingly, the method embodiment 100 comprises pruning block internal paths only.

Figure 2:
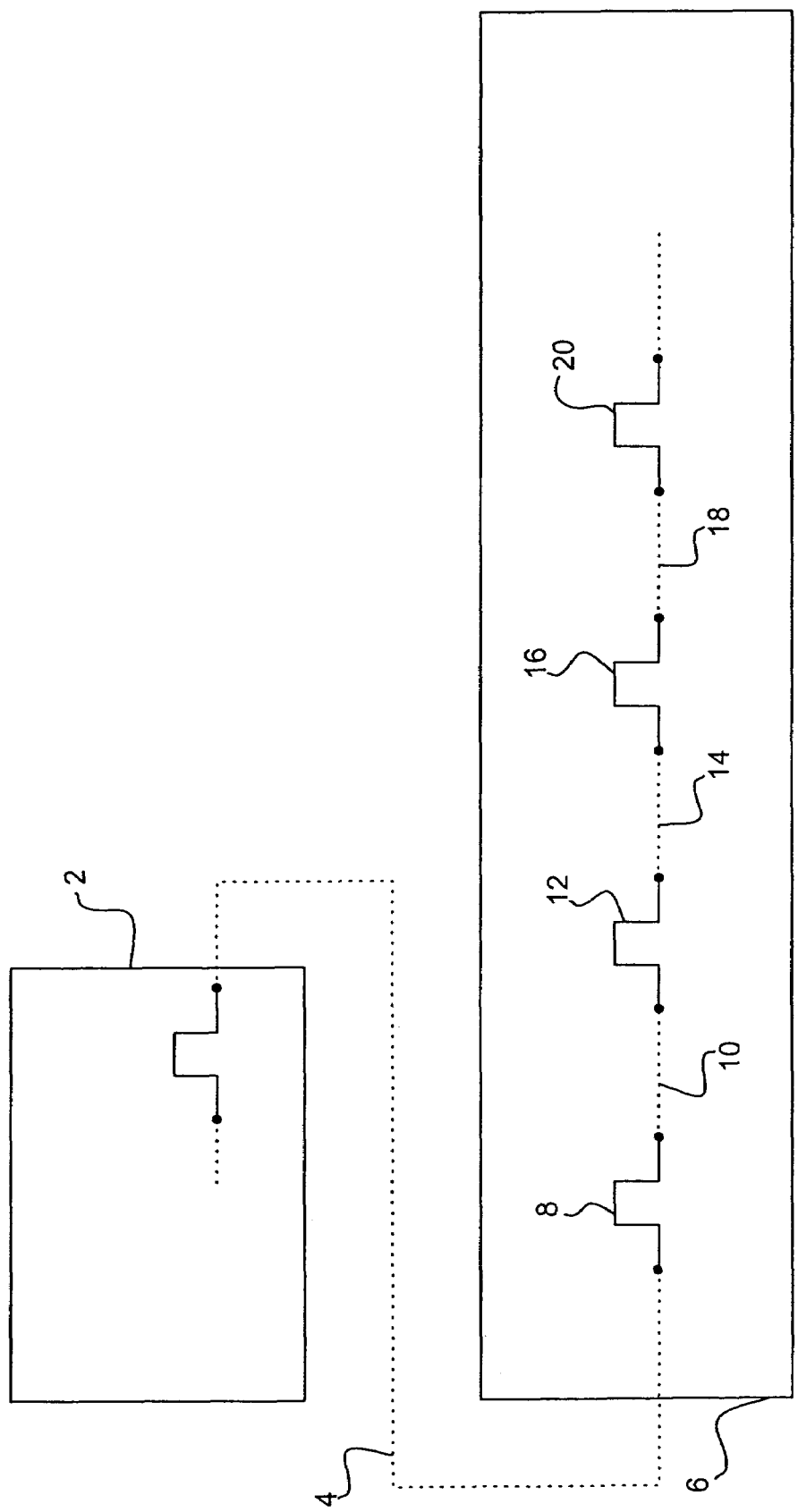
FIG. 2 is a schematic of a portion of an integrated circuit useful for illustration of an invention embodiment.

Various aspects of an example invention embodiment may be appreciated through a detailed example of practice of the embodiment 100. Accordingly, reference is made to the schematic of FIG. 2 representing a portion of an integrated circuit, in addition to the flowchart of FIG. 1. FIG. 2 illustrates portions of a first block 2 and of a second block 6, which are intended to comprise two blocks created through the embodiment step of dividing the integrated circuit into a plurality of blocks (block 102). It will be appreciated that the two blocks 2 and 4 have been illustrated for convenience only, and that in practice the number of blocks created may number from two into the thousands, hundreds of thousands, millions, or greater. The global path 4 connects the two blocks 2 and 6.

Figure 3:
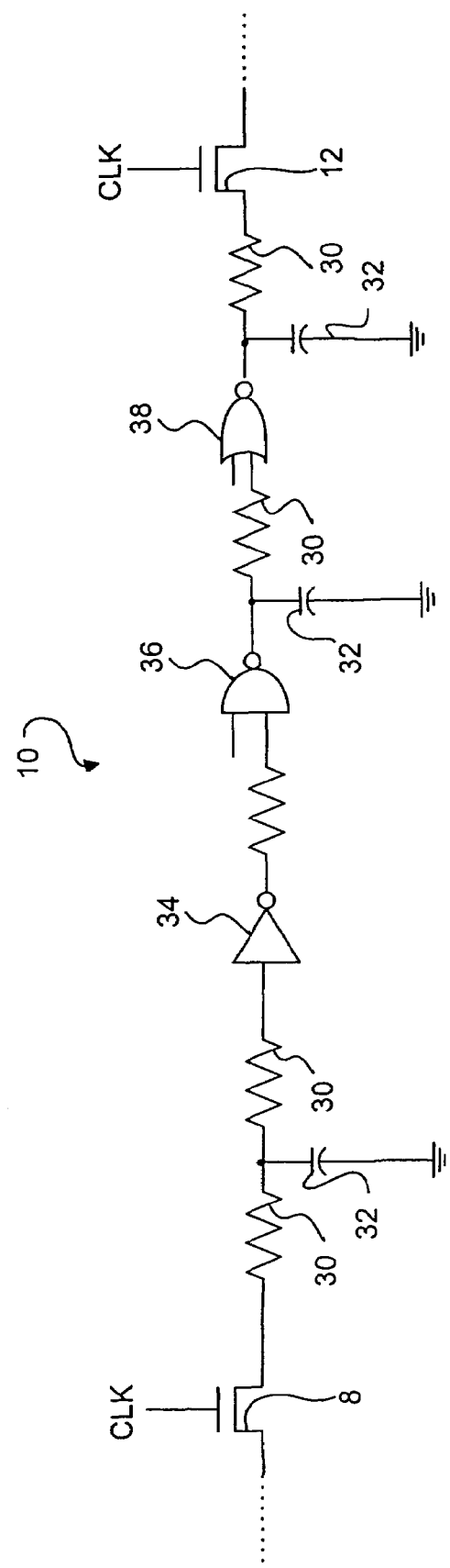
FIG. 3 is a schematic showing in greater detail a portion of the integrated circuit of FIG. 2.

In an additional step of the method embodiment, each of the blocks is compressed by reducing the detail of information regarding delay (block 104). In particular, a representative delay is calculated using the individual wire delays and gate delays along internal paths to reduce the amount of detail presented with the block. By way of example, reference is made to FIG. 3 showing in greater detail a portion of the circuit of FIG. 2. In particular, latches 8 and 12 are illustrated, with the path 10 connecting the latches show in greater detail. Latches 8 and 12 may comprise transistors such as field effect transistors (FET) or the like, and may be connected to a clock signal (CLK). The path 10 comprises a plurality of resistors 30 and capacitors 32, each of which have individual delays associated with them. Gates are also distributed along the path, including the inverter gate 34, the NAND gate 36, and the NOR gate 38.

The components are distributed along the length of the path 10 to provide information as to where the resistance/capacitance and gates will be encountered. Each of the individual delays associated with conducting medium carrier such as metal layers, the individual capacitors and resistors may be categorized as a wire delay. The delay associated with the gates 34-38 is categorized as gate delays. It will be appreciated that a resistance is associated with the conducting medium itself that connects the latches 8 and 12, and that this resistance may be represented as any of the resistors 30 illustrated. Also, each of the latches 8 and 12 has individual gate delays associated with them.

The method embodiment 100 comprises compressing the amount of data required for each block through a step of calculating a representative path delay using the individual gate and/or wire delays (block 104). The present invention contemplates a number of different methods for calculating this representative delay. For example, the individual components of the wire delay may be summed, and then added to the summed total of gate delays, with the result that a single delay value can be associated with each path. Further, the gates that make up the latches may be included in path delay calculations. Unless otherwise specified, as used herein the term "path delay" should be broadly interpreted to refer to the total delay a signal will encounter as it propagates through all components encountered.

Figure 4:
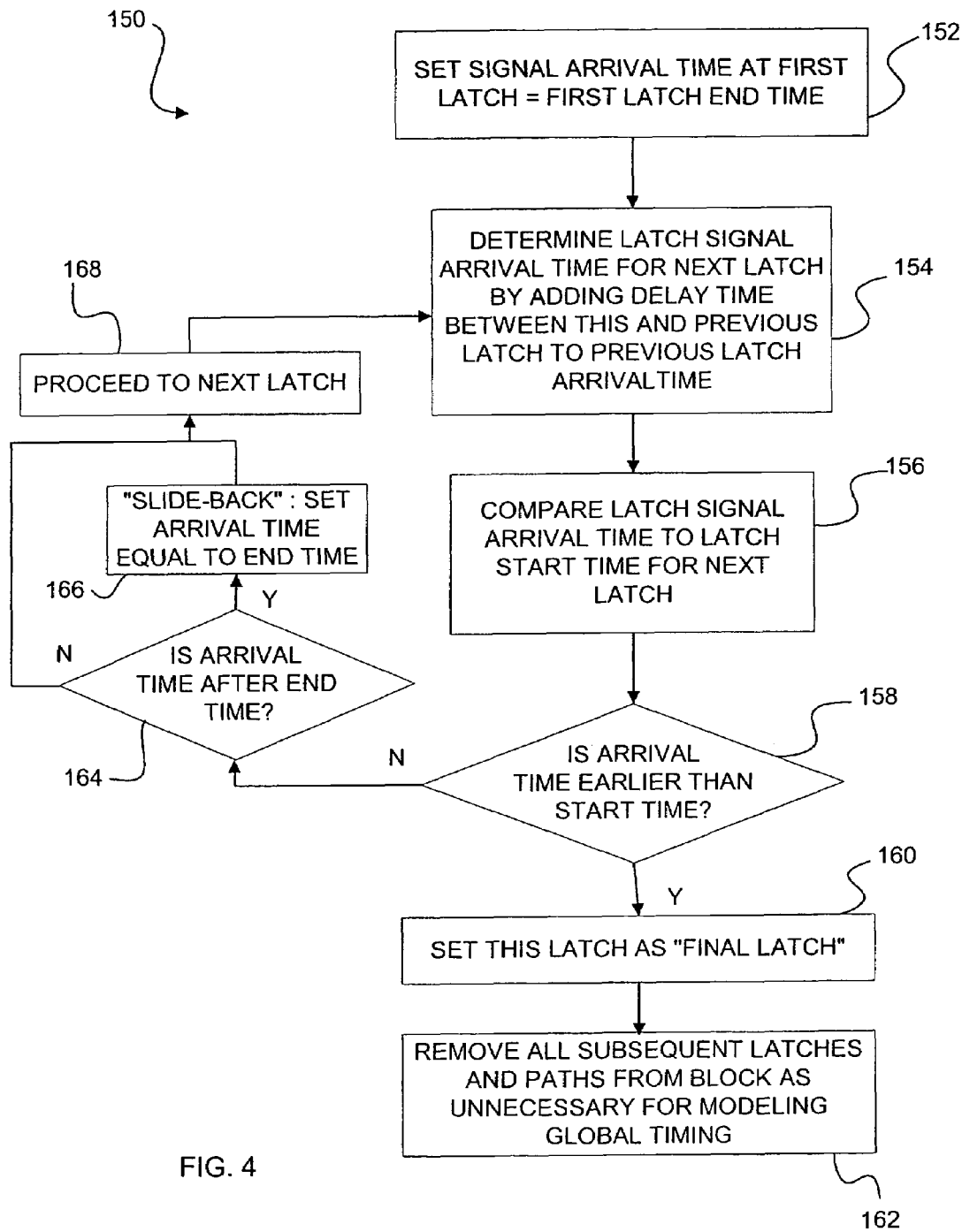
FIG. 4 is a flowchart illustrating a set of steps of a method of the invention.

In addition to compressing the block data through determining representative delay data, invention method embodiments may further comprise steps of determining which latches are required for modeling global transparency (FIG. 1, block 106), and of removing all unnecessary latches (block 108). FIG. 4 illustrates an example method embodiment 150 for accomplishing these tasks.

In general, this embodiment 150 will model a signal as it propagates through a block and latches internal to the block. It is noted that as used herein, the term "propagates" when used in this context is intended to broadly refer to a communication of the signal along one or more paths and latches. The embodiment 150 will model the timing of the signal as it propagates, and will calculate the time at which the signal arrives at particular latches. These arrival times will be compared to the "start time" at which the latch goes into an "on" state until a latch is reached at a latch arrival time that is earlier than the on time. This latch will be determined to be the final latch required for modeling transparency, with all subsequent latches able to be removed.

Reference is directed to Tables 1(a) and 1(b) below in addition to the schematic of FIG. 2 for a more detailed illustration of the embodiment 150 of FIG. 4 through an example. In further illustration of the example embodiment 150, the following definitions are also provided:

Latch on state: latch operational state in which signals pass through latch (e.g., latch switch in closed position for continuous circuit through the latch)

Latch off state: opposite to the on state; in the off state signals do not pass through the latch (e.g., latch switch in an open position so circuit through latch is broken)

Latch start time: time at which latch begins on state

Latch end time: time at which latch ends on state and begins off state (e.g., level triggered latch will remain in on state from start time at which trigger level was first detected until end time when trigger level ceases; on state exists during "timing window" between latch start time and latch end time; similarly, an edge triggered latch may be set to begin on state at detection of leading edge of high signal and remain in on state until falling edge is detected)

Latch signal arrival time: time at which signal is first received ("arrives") at respective latch TABLE 1(a)

Example Latch Data for FIG. 2

| Latch: | Start time: | End Time: | Latch Signal Arrival Time: |
|---|---|---|---|
| 8 | 1. | 1.8 | 1.8 |
| 12 | 1.9 | 2.5 | 2.3 |
| 16 | 2.7 | 3. | 3. |

TABLE 1(a)-continued

Example Latch Data for FIG. 2

| Latch: | Start time: | End Time: | Latch Signal Arrival Time: |
|---|---|---|---|
| 20 | 3.3 | 3.4 | 3.2 |
| 24 | 4 | 4.3 | — |

TABLE 1(b)

Example Latch Data for FIG. 2

| Path: | Delay: |
|---|---|
| 10 | 0.5 |
| 14 | 0.7 |
| 18 | 0.2 |
| 22 | 0.4 |

The illustrative example of carrying out the example embodiment 150 begins by setting a first latch arrival time equal to the latch end time for the first latch 8 of the block 6 (block 152). The term "first latch" is intended to refer to the initial latch in a block that receives a global incoming signal. Setting the latch signal arrival time equal to the first latch end time in essence assumes a conservative estimate of arrival time for modeling. With reference to Table 1(a), this arrival time is thereby set at 1.8. As those skilled in the art will appreciate, time may be expressed in units of milli, micro, or other factor of seconds, or may simply refer to some relative standard such as clock signal "ticks" or the like. For the purpose of the present illustrative example, particular units are not important.

The latch signal arrival time is subsequently determined for the next latch (block 154). That is, the time at which the signal will arrive at latch 12 is determined. This is accomplished by adding the path delay time across path 10 to the latch signal arrival time from latch 8. With reference to Tables 1(a) and (b), a latch signal arrival time for latch 12 is thereby calculated to be 2.3. It is noted that for purposes of the present example, the path delay times of Table 1(b) are assumed to be a representative single delay value that incorporates all wire delay and gate delays.

The method steps 150 next comprise a step of comparing the latch signal arrival time to the latch start time (block 156). If the arrival time is determined to be earlier than the latch on time (block 158), the latch will be set as the final latch (block 160) and all subsequent latches removed from the block as unnecessary for modeling global timing (block 162). If the arrival time is not earlier than the latch start time, the next downstream latch will be analyzed (block 159). In general, these steps make a determination of whether a signal arrives at a given latch before the latch on state has begun. If so, the signal will not be immediately transmitted through the latch, but will instead have to "wait" for the on state (e.g., wait for the latch start time before proceeding). If the signal arrives during the latch on state (e.g., after the latch start time), it will of course immediately be communicated downstream.

In additional steps of this invention embodiment, provision is made for the occurrence of a signal arriving after the latch end time (e.g., arrives after "window" closed when latch is in an off state). Specifically, if it is determined that the arrival time is after the end time (block 164), the arrival time is set equal to the latch end time (block 166). In effect, the arrival time is subject to a "slide-back." This slide-back is deemed acceptable in that the embodiment has some timing "slack" to take advantage of in that it conservatively sets the initial arrival time in the block as equal to the first latch end time. Additional latches are then analyzed (blocks 168, 154-158).

With reference to the Tables 1(a) and (b), the latch signal arrival time for latch 12 of 2.3 is greater than the latch start time of 1.9 and less than the end time of 2.5, so the steps 150 will proceed to analysis of the next downstream latch (blocks 156, 158, and 159). Accordingly, a latch signal arrival time of 3. is calculated for latch 16 by adding the path delay of 0.7 to the latch signal arrival time of 2.3 for latch 12 (block 156). This latch signal arrival time is compared to the latch start time of 2.7 (block 156) and determined to be later (block 158). The arrival time is then compared to the end time of 3 (block 164). Accordingly, the next latch is examined (block 168).

A latch signal arrival time of 3.2 is calculated for latch 20 (block 154). When compared with the latch start time of 3.3 (block 156), the arrival time is determined to be earlier than the start time (block 158). As a result, the latch 20 is set as the "final latch" (block 160), and all subsequent downstream latches removed from the block (block 162). It is noted that latches having a global path are not removed, even if they are downstream of the final latch. Latches having global paths are of course required for global timing modeling.

Preferably, the stripping out of internal latches does not occur until after all incoming global paths have been evaluated for a block. In particular, a "final" latch is determined for each incoming global path as it propagates into the block over various sequential paths and latches. After all the final latches have been determined for each incoming global signal propagating through the block, then all remaining internal blocks downstream of all final latches are stripped out.

The embodiment 150 results in a block model having a significantly compressed format to achieve substantially reduced memory and processing requirements. All that remains in the block is a model of a "border zone" of latches that may potentially receive signals while in their on state. Also, this border zone is represented with compressed delay data. This border zone allows for effective modeling of global transparency. Accordingly, the steps 150 have resulted in creation of a compressed model advantageously containing abbreviated data, but retaining sufficient detail to model global transparency. Problems of the prior art are thereby resolved.

With reference once again made to FIG. 1, a method embodiment 100 further comprises a step of pruning the blocks to remove all incoming paths to a given latch except for the path having the largest delay (block 110). Pruning of the internal paths can be accomplished through analyzing each latch and each internal path terminating at the respective latch. Pruning is preferably practiced on the individual blocks only to remove internal paths, and not to remove any global paths. Removal of global paths has been discovered to be disadvantageous under some circumstances as paths may be pruned that although not having the largest delay, may yet have delay associated with them in an amount substantial enough to effect global timing.

Many currently available IC modeling tools such as commercial program products do not allow for selectively pruning only block internal paths verses global paths. Accordingly, an embodiment of the present invention comprises additional method steps useful for effectively "modifying" practice of currently available modeling tools so that only block internal paths will be pruned.

These embodiment steps generally comprise identifying latches in each of the blocks that are connected to more than one incoming global path, creating a "clone" latch for each of the global paths greater than one, and connecting one each of the global paths greater than one to one each of the clone latches. That is, every latch having more than one incoming global path will have all of the global paths except for one removed. One each of the removed global paths will be connected to one each newly created clone latches. As a result, each global path will terminate at a latch having only one incoming global path. When pruning is carried out, no paths will thus be removed and consideration of each and every global path will be made.

Figure 5A:
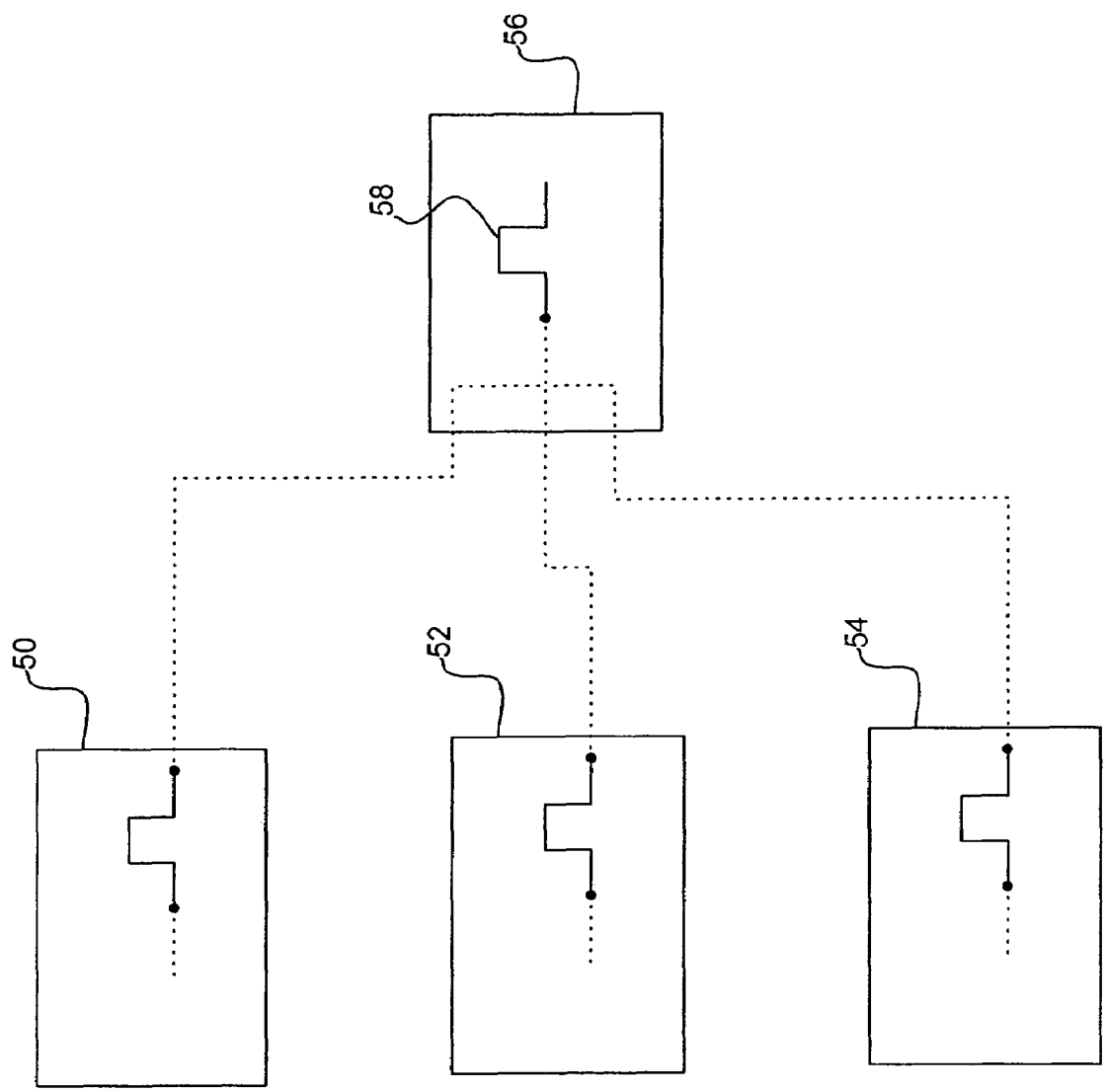
FIGS. 5(a) and 5(b) are schematics of a portion of an integrated circuit, before and after, respectively, practice of a pruning step of an invention embodiment.
Figure 5B:
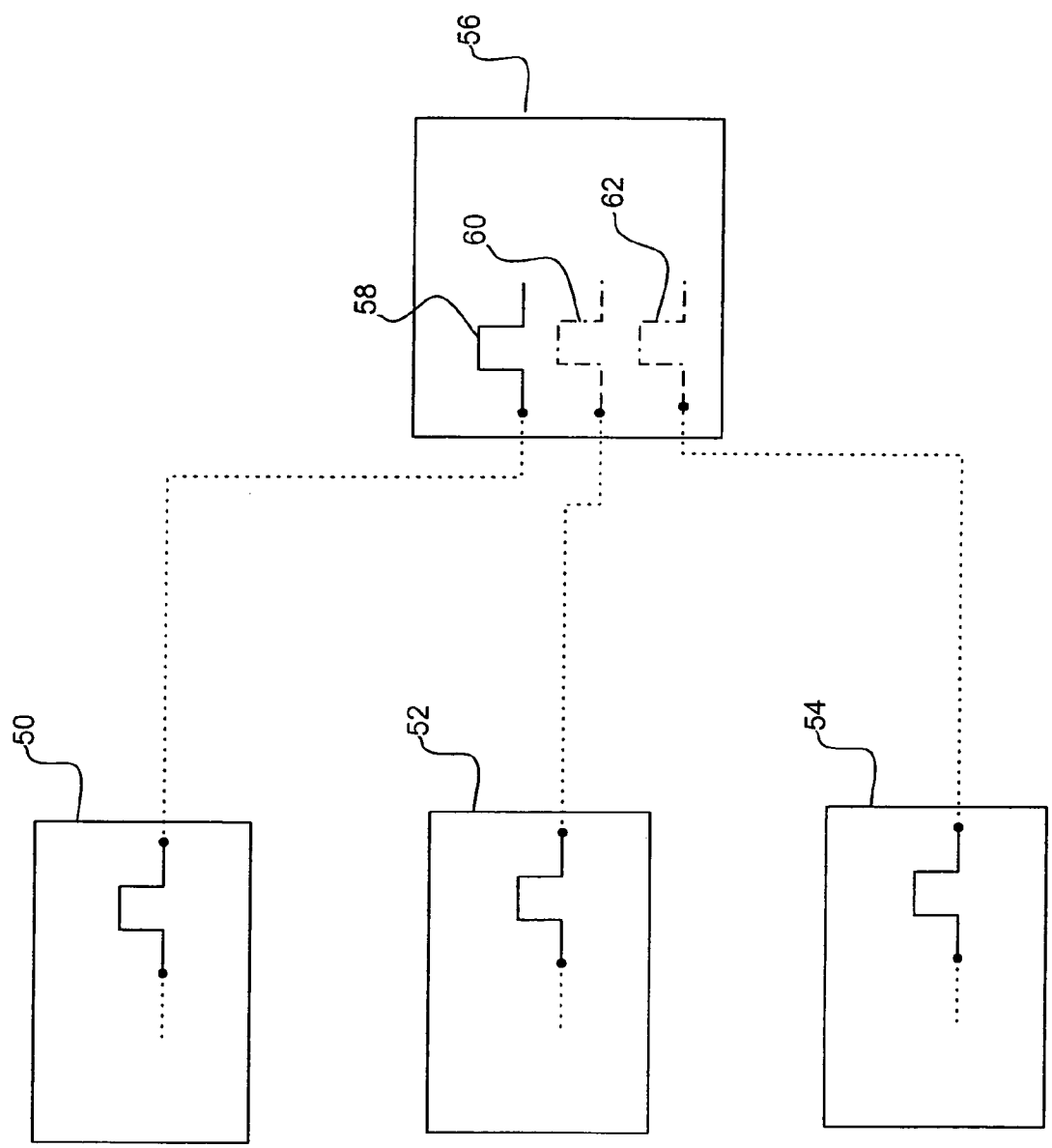

These steps may be further illustrated through example. FIG. 5(a) illustrates a portion of an IC, with three blocks 50, 52, and 54 all having latches that send a global path to a single latch 58 on a second block 56. Accordingly, the latch 58 has three incoming global paths. Pruning through invention embodiment steps will proceed by first identifying latch 58 as having more than one incoming global path. In an additional step, a clone latch will be created for each incoming global path greater than one. FIG. 5(b) illustrates clone latches 60 and 62 that have been created. A subsequent embodiment step comprises removing one each of the incoming global paths greater than one from the latch 58 and attaching one each of these to one each of the created clone latches. This result is illustrated in the schematic of FIG. 5(b), where each latch 58, 60, and 62 have one incoming global path connected to them, and no latch has more than one incoming global path.

It is noted that "clone latches" as used herein is intended to refer to virtual or otherwise non-physically existing latches that are useful for modeling purposes but that do not have an actual physical counterpart in the IC. The clone latches 60 and 62 can be considered to be connected downstream to the original latch 58 over a path that has a zero delay for modeling purposes, with the result that signals received at the clone latch 60 or 62 will be modeled downstream as consistent with having been received at the original latch 58.

Those knowledgeable in the art will appreciate that the present invention is well suited for practice in the form of a computer program product. Accordingly, embodiments of the present invention comprise computer program products comprising computer executable instructions embedded in a computer readable medium that when executed cause a computer to carry out the steps of method embodiments of the invention. It will therefore be appreciated that discussion made herein in reference to method embodiments of the invention may likewise apply to program product embodiments, with the understanding that the method steps may be carried out by a computer executing a program product of the invention.

Those knowledgeable in the art will appreciate that computer program product embodiments may comprise computer readable instructions created using programming languages such as Fortran, visual basic, C++, PERL, SGML, and the like, that have been compiled or otherwise exist in a machine readable format. These instructions may be embedded in a computer readable medium that may comprise, by way of example, magnetic or optical media such as disks and the like. It will also be appreciated that computer program products of the invention may utilize computer or communications networks, with an example being the Internet, so that they may be operable remotely over a network. In such instances, a program product embodiment may comprise Internet protocol operability.

It will also be appreciated that the term "computer" as used herein is intended to broadly refer to processor-based devices capable of executing computer readable instructions. A "computer" as used herein is thereby not limited to desktop computers, laptop computers, mainframe computers, and the like, but may also comprise devices such as a dedicated circuit testing device and the like.

Those knowledgeable in the art will appreciate that the present invention is not limited to the particular embodiments described and discussed herein. Indeed, the present invention will prove valuable in a wide variety of applications not described or discussed herein. As an example, it will be appreciated that the present invention is not limited to practice in the form of a method and/or program product limited to carrying out timing analysis of IC's.

The advantages of the disclosed invention are thus attained in an economical, practical, and facile manner. While example embodiments and configurations have been shown and described, it is to be understood that various further modifications and additional configurations will be apparent to those skilled in the art. It is intended that the specific embodiments and configurations herein disclosed are illustrative of example and best modes for practicing the invention, and should not be interpreted as limitations on the scope of the invention as defined by the appended claims.

What is claimed is:

1. A method for making an integrated circuit model for an integrated circuit comprising the steps of:

dividing the integrated circuit into a plurality of connected blocks, each block having a plurality of latches, at least one of said latches on each of said blocks having a global path connected to a latch from a second of said plurality of blocks;

compressing each of said blocks by removing all of said latches from each of said blocks not required for modeling global transparency;

identifying said latches in each of said blocks that are connected to more than one incoming global path; and creating a clone latch for each of said incoming global paths greater than one for each of said identified latches, moving one of said incoming global paths from each of said identified latches to one of said clone latches whereby each of said identified latches and each of said clone latches are connected to one incoming global path.

2. A method for making an integrated circuit model as in claim 1, wherein the method further comprises the step of pruning the integrated circuit model by removing from each latch all incoming paths except for the path having the greatest delay.

3. A computer program product for modeling an integrated circuit comprising computer executable instructions stored in a computer readable medium that when executed cause a computer to:

divide the integrated circuit into a plurality of connected blocks, each block having a plurality of latches, at least one of said latches on each of said blocks having a global path connected to a latch from a second of said plurality of blocks, each of said latches in each of said blocks having at least one internal path connected to others of said latches in said block;

compress each of said blocks by removing all of said latches not required for modeling global transparency identify said latches in each of said blocks that are connected to more than one incoming global path;

create a clone latch for each of said incoming global paths greater than one for each of said identified latches, move one of said incoming global paths from each of said identified latches to one of said clone latches whereby each of said identified latches and each of said clone latches are connected to one incoming global path; and prune the integrated circuit model by removing all incoming paths to each latch except for the path having the largest delay.

4. A computer program product for modeling an integrated circuit comprising computer executable instructions stored on a computer readable medium that when executed cause a computer to:

divide the integrated circuit into a plurality of connected blocks, each block having a plurality of latches, at least one of said latches on each of said blocks having a global path connected to a latch from a second of said plurality of blocks, each of said latches in each of said blocks having at least one internal path connected to others of said latches in said block, each of said paths having a gate delay equal to the sum of the delays for all gates along said path, each of said internal paths having a wire delay, at least a first of said latches being connected to an incoming global path;

compress each of said blocks by calculating a representative path delay for each path using said gate delays and said wire delays, remove latches for each of said blocks not required for modeling global transparency, pruning said blocks by removing all incoming internal paths for each of said latches in each of said blocks except for said incoming path resulting in the largest path delay, identify said latches in each of said blocks that are connected to more than one incoming global path, create a clone latch for each of said incoming global paths greater than one for each of said identified latches, move one of said incoming global paths from each of said identified latches to one of said clone latches whereby each of said identified latches and each of said clone latches are connected to one incoming global path.

* * * * *